(12) United States Patent
Hayashi et al.

(10) Patent No.: US 11,904,522 B2
(45) Date of Patent: Feb. 20, 2024

(54) IMPRINT APPARATUS AND METHOD FOR MANUFACTURING ARTICLE

(71) Applicant: CANON KABUSHIKI KAISHA, Tokyo (JP)

(72) Inventors: Tatsuya Hayashi, Utsunomiya (JP); Tomomi Funayoshi, Utsunomiya (JP); Kenichi Kobayashi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 469 days.

(21) Appl. No.: 16/833,168

(22) Filed: Mar. 27, 2020

(65) Prior Publication Data
US 2020/0223126 A1 Jul. 16, 2020

Related U.S. Application Data

(63) Continuation of application No. PCT/JP2018/033851, filed on Sep. 12, 2018.

(30) Foreign Application Priority Data

Sep. 29, 2017 (JP) .................................. 2017-191760

(51) Int. Cl.
*B29C 59/16* (2006.01)

(52) U.S. Cl.
CPC .................................. *B29C 59/16* (2013.01)

(58) Field of Classification Search
CPC ... G03F 1/70191; G03F 7/0002; B29C 59/02; B29C 59/16
See application file for complete search history.

(56) References Cited

U.S. PATENT DOCUMENTS

| | | | |
|---|---|---|---|
| 2003/0138704 A1 | 7/2003 | Mei et al. | |
| 2009/0200710 A1* | 8/2009 | Khusnatdinov | B82Y 10/00 264/293 |
| 2011/0177261 A1* | 7/2011 | Ishii | G02F 1/133308 156/273.5 |
| 2013/0078821 A1 | 3/2013 | Furutono | |

(Continued)

FOREIGN PATENT DOCUMENTS

| | | |
|---|---|---|
| CN | 1434349 A | 8/2003 |
| CN | 101939704 A | 1/2011 |

(Continued)

*Primary Examiner* — Daniel McNally
(74) *Attorney, Agent, or Firm* — CANON U.S.A., INC. IP Division (57) ABSTRACT

An imprint apparatus that forms a pattern of an imprint material on a substrate by using a mold includes a mold holder that holds the mold and an optical system that irradiates the imprint material on the substrate with irradiation light for increasing a viscosity of the imprint material. The irradiation light has a light intensity distribution such that a light intensity increases from a center of a pattern portion of the mold toward a side surface of the pattern portion when the mold is held by the mold holder. The imprint material that moves from the center of the pattern portion of the mold toward the side surface of the pattern portion in a region including the side surface of the pattern portion of the mold is irradiated with the irradiation light while the mold and the imprint material on the substrate are in contact with each other.

13 Claims, 9 Drawing Sheets

(56) References Cited

U.S. PATENT DOCUMENTS

| | | |
|---|---|---|
| 2013/0241109 A1 | 9/2013 | Khusnatdinov et al. |
| 2014/0071417 A1* | 3/2014 | Grespan .................. G01N 33/00 156/275.5 |
| 2014/0272174 A1 | 9/2014 | Furutono |
| 2014/0340660 A1 | 11/2014 | Suzuki et al. |
| 2015/0036117 A1* | 2/2015 | Menon .................. B82Y 10/00 264/293 |
| 2016/0136872 A1 | 5/2016 | Yanagisawa |

FOREIGN PATENT DOCUMENTS

| | | |
|---|---|---|
| DE | 60310460 T2 | 12/2007 |
| EP | 1331516 A2 | 7/2003 |
| EP | 2240826 A1 | 10/2010 |
| JP | 2003-249444 A | 9/2003 |
| JP | 2011-521438 A | 7/2011 |
| JP | 2011-181548 A | 9/2011 |
| JP | 2013-69918 A | 4/2013 |
| JP | 2013-69919 A | 4/2013 |
| JP | 2013-110196 A | 6/2013 |
| JP | 2014-179527 A | 9/2014 |
| JP | 2014-188869 A | 10/2014 |
| JP | 2014-229670 A | 12/2014 |
| JP | 2015-106670 A | 6/2015 |
| JP | 2016-58735 A | 4/2016 |
| JP | 2016-96269 A | 5/2016 |
| KR | 2000-0053428 A | 8/2000 |
| KR | 20030080183 A | 10/2003 |
| KR | 20100123698 A | 11/2010 |
| KR | 20160054631 A | 5/2016 |
| TW | 200302506 A | 8/2003 |
| TW | 200834239 A | 8/2008 |
| TW | 200938949 A | 9/2009 |
| TW | 201139118 A | 11/2011 |
| TW | 201247394 A | 12/2012 |
| TW | 201346334 A | 11/2013 |
| TW | 201729005 A | 8/2017 |
| WO | 2009099666 A1 | 8/2009 |

* cited by examiner

FIG. 4C (1) SHOT REGION       (2) OUTER PERIPHERAL IRRADIATION       (3) CURING EXPOSURE

IMPRINT APPARATUS AND METHOD FOR MANUFACTURING ARTICLE

CROSS-REFERENCE TO RELATED APPLICATIONS

This application is a Continuation of International Patent Application No. PCT/JP2018/033851, filed Sep. 12, 2018, which claims the benefit of Japanese Patent Application No. 2017-191760, filed Sep. 29, 2017, both of which are hereby incorporated by reference herein in their entirety.

TECHNICAL FIELD

The present invention relates to an imprint apparatus and a method for manufacturing an article.

BACKGROUND ART

An imprint apparatus brings a mold into contact with an imprint material, such as a resin, placed on a substrate and cures the imprint material to form a cured product of the imprint material with a pattern on the substrate. The imprint apparatus applies a pressing force to the imprint material and the mold when the mold is brought into contact with the imprint material placed in a shot region on the substrate. Therefore, the imprint material may move to spread and protrude outward from the shot region or outward from an edge of the substrate.

PTL 1 discloses a process of irradiating a region at and around a boundary of a pattern forming region with UV light when a mold is brought into contact with a resin placed in an edge shot region on a substrate, thereby curing the resin that spreads toward the edge of the substrate and preventing the resin from protruding.

CITATION LIST

Patent Literature

PTL 1 Japanese Patent Laid-Open No. 2013-69919

PTL 1 does not specifically describe the light intensity distribution of the UV light with which the region at and around the boundary of the pattern forming region is irradiated. When, for example, the resin that spreads to the edge of the substrate is completely cured by being irradiated with light having a uniform intensity distribution, the mold and the substrate are fixed in a contact state. This complicates the subsequent process of positioning the shot region of the substrate and the pattern of the mold with respect to each other. In addition, according to PTL 1, no countermeasures are taken against the resin that protrudes to side surfaces of a portion (mesa) of the mold on which the pattern is formed and that forms unnecessary projecting and recessed portions.

The present invention provides an imprint apparatus that positions a substrate and a mold with respect to each other and reduces protrusion of an imprint material on the substrate when the imprint material and the mold are brought into contact with each other.

SUMMARY OF INVENTION

To solve the above-described problem, according to an aspect of the present invention, an imprint apparatus that forms a cured product of an imprint material on a substrate by using a mold having a mesa includes a mold holder that holds the mold and an optical system that irradiates the imprint material on the substrate with irradiation light for increasing a viscosity of the imprint material. The irradiation light has a light intensity distribution such that a light intensity increases from a center of the mesa of the mold toward a side surface of the mesa when the mold is held by the mold holder. The imprint material that moves from the center of the mesa of the mold toward the side surface of the mesa in a region including the side surface of the mesa is irradiated with the irradiation light while the mold and the imprint material on the substrate are in contact with each other.

According to another aspect of the present invention, an imprint apparatus that forms a cured product of an imprint material on a substrate by using a mold includes a mold holder that holds the mold and an optical system that irradiates the imprint material on the substrate with irradiation light. The optical system uses a spatial light modulator to perform entire irradiation, in which an entirety of a shot region of the substrate is irradiated, and outer peripheral irradiation, in which an outer peripheral region of the shot region is selectively irradiated.

According to another aspect of the present invention, an imprint apparatus that forms a cured product of an imprint material on a substrate by using a mold having a mesa includes a mold holder that holds the mold and an optical system that irradiates the imprint material on the substrate with irradiation light for increasing a viscosity of the imprint material. The optical system selectively irradiates a region including a side surface of the mesa with the irradiation light while the mold and the imprint material on the substrate are in contact with each other.

Further features of the present invention will become apparent from the following description of exemplary embodiments with reference to the attached drawings.

DESCRIPTION OF EMBODIMENTS

Embodiments of the present invention will now be described with reference to the accompanying drawings.

First Embodiment

An imprint apparatus brings an imprint material supplied to a substrate and a mold into contact with each other and applies energy for curing to the imprint material to form a cured product having a pattern obtained by transferring a projecting and recessed pattern of the mold. For example, the imprint apparatus supplies the imprint material to the substrate and cures the imprint material while a mold having a projecting and recessed pattern is in contact with the imprint material on the substrate. Then, a gap between the mold and the substrate is increased to separate the cured imprint material from the mold (mold separation). Thus, the pattern of the mold can be transferred to the imprint material on the substrate. This process is referred to as an imprint process. Each of a plurality of shot regions of the substrate is subjected to the imprint process. When the imprint process is performed on each of a plurality of shot regions of a single substrate, the imprint process is repeated the same number of times as the number of shot regions on the substrate.

Figure 1:
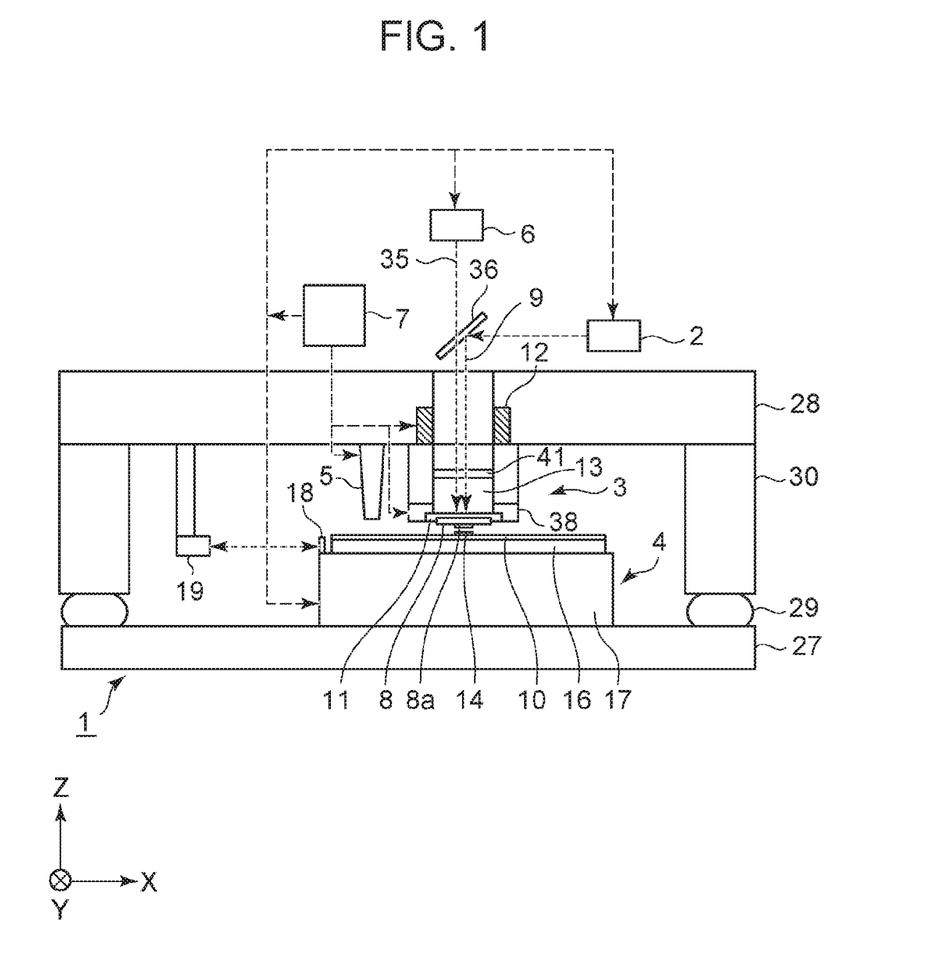
FIG. 1 illustrates the structure of an imprint apparatus.

An imprint apparatus according to a first embodiment will now be described. FIG. 1 illustrates the structure of an imprint apparatus 1 according to the present embodiment. This imprint apparatus 1 is used in manufacture of, for example, a semiconductor device, which serves as an article. The imprint apparatus 1 forms an uncured resin 14 on a substrate 10 into a desired shape by using a mold 8, thereby forming a resin pattern on the substrate 10. The imprint apparatus 1 described herein uses a photo-curing method, for example. In FIG. 1, the Z-axis is parallel to the optical axis of ultraviolet light 9 incident on the resin 14 on the substrate 10, and the X-axis and the Y-axis are orthogonal to each other on a plane perpendicular to the Z-axis. The imprint apparatus 1 includes an exposure illumination system 2, a mold holding mechanism 3, a substrate stage 4, an application unit 5, a shape correction mechanism 38, and a control unit 7.

The exposure illumination system 2 irradiates the mold 8 and the substrate 10 with the ultraviolet light 9 in the imprint process. The exposure illumination system 2 includes a light source and an optical element that adjusts the ultraviolet light 9 emitted from the light source so that the ultraviolet light 9 is suitable for imprinting. The ultraviolet light 9 is reflected by a dichroic mirror 36 and guided to the mold 8 and the substrate 10.

The mold 8 has a square outer periphery, and includes a projecting portion (referred to also as a pattern portion or mesa) that projects from a surrounding portion in a central region of a surface that faces the substrate 10. The pattern portion has a projecting pattern surface 8a having a three-dimensional projecting and recessed pattern, such as a circuit pattern, that is to be transferred. The mesa also includes side surfaces 8b. The mold 8 is made of a material capable of transmitting the ultraviolet light 9. In the present embodiment, the material is quartz, for example. To facilitate deformation of the pattern surface 8a by the shape correction mechanism 38, which will be described below, the mold 8 may have a cavity (recess) of a certain depth having a circular shape in plan view in a surface irradiated with the ultraviolet light 9 (back surface opposite to the surface on which the mesa is provided).

The mold holding mechanism 3 includes a mold holder 11 that holds the mold 8 and a mold driving mechanism 12 that holds the mold holder 11 and that controls the position of the mold 8 and moves the mold 8 in the Z direction. The mold holder 11 is capable of holding the mold 8 by applying a vacuum suction force or an electrostatic force for attracting the mold 8 in an outer peripheral region of an irradiation surface of the mold 8 irradiated with the ultraviolet light 9. When, for example, the mold holder 11 holds the mold 8 by applying a vacuum suction force, the mold holder 11 is connected to an external vacuum pump and the mold 8 is held and released by turning on and off the vacuum pump. The mold holder 11 and the mold driving mechanism 12 have an opening region 13 in a central region (inner region) thereof so that the ultraviolet light 9 emitted from the exposure illumination system 2 travels toward the substrate 10. A light transmitting member 41 (for example, a quartz plate) may be placed in the opening region 13 to seal a space surrounded by a portion of the opening region 13 and the mold 8, and the pressure in the space in the opening region 13 may be adjustable by a pressure adjusting device (not shown) including a pressure source. For example, when the mold 8 and the resin 14 on the substrate 10 are pressed against each other, the pressure adjusting device may set the pressure in the space to a pressure higher than that in the region outside the space so that the pattern surface 8a of the mesa is bent convexly toward the substrate 10 and that the central region of the pattern surface 8a comes into contact with the resin 14 first. As a result, air does not remain between the pattern surface 8a and the resin 14, and the resin 14 reliably spreads over projecting and recessed portions of the pattern surface 8a. Instead of bending the pattern surface 8a convexly toward the substrate 10, a surface of the substrate 10 on which the resin 14 is applied may be bent convexly toward the pattern surface 8a when the mold 8 and the substrate 10 are brought into contact with each other.

The mold driving mechanism 12 selectively presses the mold 8 and the resin 14 on the substrate 10 against each other or separates the mold 8 and the resin 14 on the substrate 10 from each other. Examples of actuators that may be used as the mold driving mechanism 12 include a voice coil motor and an air cylinder. To achieve high-precision positioning of the mold 8, the mold driving mechanism 12 may include a plurality of driving systems including, for example, a coarse driving system and a fine driving system. The mold driving mechanism 12 may also have a function of position adjustment in the X-axis direction, Y-axis direction, or θ-axis direction (rotation around the Z-axis) in addition to the Z-axis direction and a tilt function for correcting the inclination of the mold 8. The imprint apparatus 1 may perform the operation of pressing and separating the pattern surface 8*a* by moving the mold 8 in the Z-axis direction. Alternatively, however, the operation may be performed by moving the substrate stage 4 in the Z-axis direction, or by moving both the mold 8 and the substrate stage 4 relative to each other.

The substrate 10 is, for example, a Si wafer. The substrate 10 may instead be a glass substrate or a blank mask.

The substrate stage 4 holds the substrate 10 and positions the mold 8 and the substrate 10 with respect to each other when the mold 8 and the resin 14 on the substrate 10 are pressed against each other. The substrate stage 4 includes a substrate holder 16 that holds the substrate 10 by applying a vacuum suction force or an electrostatic force and a substrate-stage driving mechanism 17 that mechanically holds the substrate holding mechanism 16 and that is capable of moving the substrate holding mechanism 16 in the direction of each axis. Examples of actuators that may be used as the substrate-stage driving mechanism 17 include a linear motor and a planar pulse motor. The substrate-stage driving mechanism 17 may also include a plurality of driving systems including, for example, a coarse driving system and a fine driving system for each of X-axis and Y-axis directions. The substrate-stage driving mechanism 17 may also include a driving system for position adjustment in the Z-axis direction or have a function of adjusting the position of the substrate 10 in the θ direction or a tilt function for correcting the inclination of the substrate 10.

The substrate stage 4 is provided with a plurality of reference mirrors 18 on side surfaces thereof, each reference mirror 18 corresponding to one of X, Y, Z, ωx, ωy, and ωz directions. The imprint apparatus 1 includes a plurality of laser interferometers (length measuring devices) 19 that emit beams toward the reference mirrors 18 to measure the position of the substrate stage 4. The laser interferometers 19 measure the position of the substrate stage 4, and the control unit 7, which will be described below, controls the position of the substrate 10 (substrate stage 4) based on the measurement values.

The application unit 5 is disposed near the mold holding mechanism 3, and applies the resin (uncured resin) 14 to the substrate 10. The resin 14 is a photo-curable resin (imprint material, composite) that is cured when irradiated with the ultraviolet light 9. The resin 14 is selected as appropriate based on various conditions of, embodiment, a process of manufacturing an article, such as a semiconductor device. The amount of resin 14 discharged from the application unit 5 is also determined as appropriate based on, for example, the desired thickness of the resin 14 formed on the substrate 10 and the density of the pattern to be formed.

The imprint apparatus 1 includes an alignment measurement unit 6 used to obtain information of the relative position between the mold 8 and the substrate 10 in the imprint process. Alignment light 35 is emitted from the alignment measurement unit 6 and passes through the dichroic mirror 36, and alignment marks formed on the mold 8 and the substrate 10 are irradiated with the alignment light 35. The alignment light 35 reflected by the alignment marks is received by the alignment measurement unit 6. Thus, the information of relative position between the mold 8 and the substrate 10 is obtained.

The control unit 7 is capable of controlling the operations and adjustments of components included in the imprint apparatus 1. The control unit 7, which is composed of a computer, for example, is connected to the components of the imprint apparatus 1 by lines and is capable of controlling the components based on, for example, programs. The control unit 7 of the present embodiment controls the operations of at least the mold holding mechanism 3, the substrate stage 4, the shape correction mechanism 38, the exposure illumination system 2, and the alignment measurement unit 6. These components form, for example, shape correcting means for correcting the shape of the mold and positioning means for positioning the mold and the substrate. The control unit 7 may be formed integrally with other portions of the imprint apparatus 1 (in the same housing) or separately from other portions of the imprint apparatus 1 (in a different housing).

The imprint apparatus 1 further includes a base surface plate 27 on which the substrate stage 4 is placed, a bridge surface plate 28 that supports the mold holding mechanism 3, and support pillars 30 that extend from the base surface plate 27 and support the bridge surface plate 28 with vibration isolators 29 provided between the base surface plate 27 and the support pillars 30. The vibration isolators 29 isolate vibration that is transmitted from the floor surface toward the bridge surface plate 28. The imprint apparatus 1 may further include a mold conveying mechanism that conveys the mold 8 from the outside of the apparatus to the mold holding mechanism 3 and a substrate conveying mechanism that conveys the substrate 10 from the outside of the apparatus to the substrate stage 4.

Figure 2:
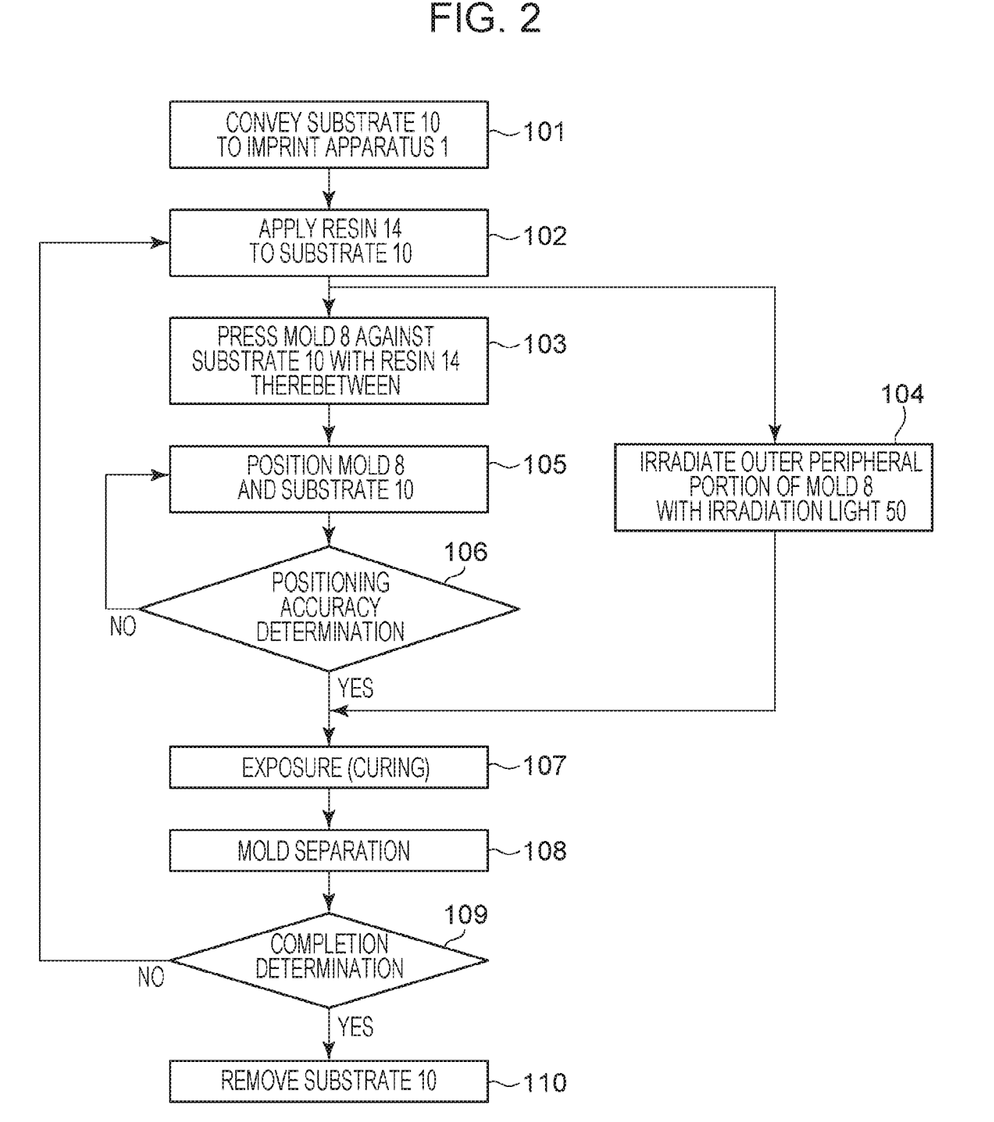
FIG. 2 is a flowchart of an imprint process.

An imprint process performed by using the imprint apparatus 1 will now be described. FIG. 2 is a flowchart of the imprint process performed by using the imprint apparatus 1.

Figure 3A:
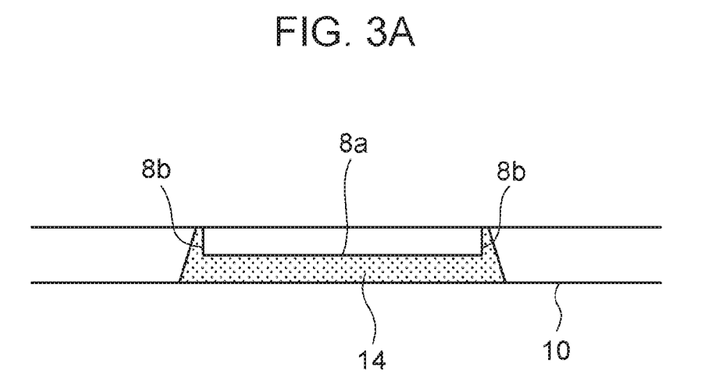
FIG. 3A illustrates a resin that protrudes to side surfaces of a mold.
Figure 3B:
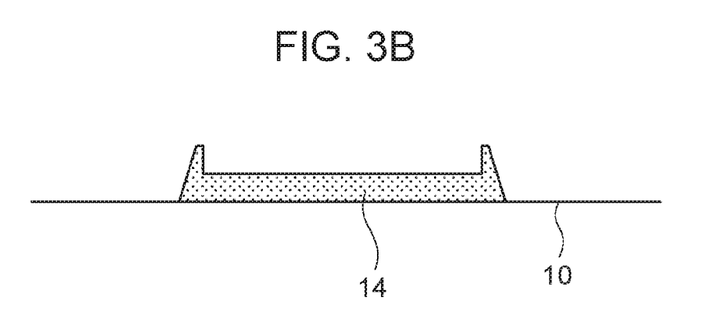
FIG. 3B illustrates the resin that protrudes to the side surfaces of the mold.

First, in step 101, the substrate 10 is conveyed into the imprint apparatus 1. Next, in step 102, the application unit 5 applies (discharges) the resin 14 to the substrate 10 in a shot region in which the imprint process is to be performed. In step 103, the mold 8 is brought into contact with and pressed against the resin 14 applied to the substrate 10. Since the wettability between the resin 14 and the mold 8 is high, as illustrated in FIG. 3A, the resin 14 may spread and adhere to the side surfaces 8*b* of the mesa of the mold 8. When the resin supplied to the pattern portion of the mold is cured while the resin 14 is on the side surfaces 8*b* and then the mold 8 is removed from the resin 14, as illustrated in FIG. 3B, the resin 14 includes projecting portions that correspond to the side surfaces 8*b*. When the resin 14 includes the projecting portions, the film thickness varies and problems occur in, for example, an etching process performed in a subsequent step. If a portion of the resin 14 that has adhered to the side surfaces 8*b* falls onto the substrate 10 during the imprint process and the mold 8 is pressed against the fallen portion of the resin, the pattern surface 8*a* of the mold 8 may be damaged. Furthermore, a defective device may be manufactured due to a failure in formation of a pattern on the substrate.

Figure 4A:
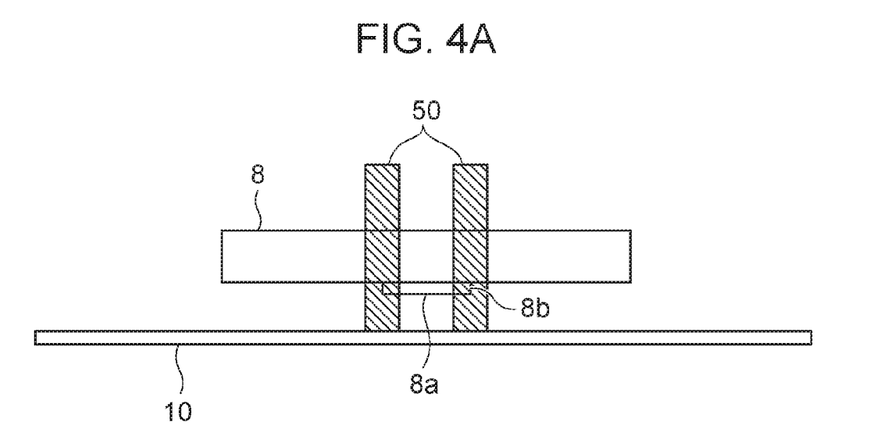
FIG. 4A illustrates irradiation light with which a region including the side surfaces of the mold is irradiated.

When the mold 8 is brought into contact with the resin 14 in step 103, a region 16 including the side surfaces 8*b* of the mesa of the mold 8 (shaded region, referred to also as an outer peripheral region of the shot region) is selectively irradiated with irradiation light 50 in step 104 (outer peripheral irradiation step). FIG. 4A illustrates a sectional view of the irradiated region 16 (shaded region) irradiated with the irradiation light 50, and FIG. 4B illustrates a plan view of the irradiated region 16.

Figure 4B:
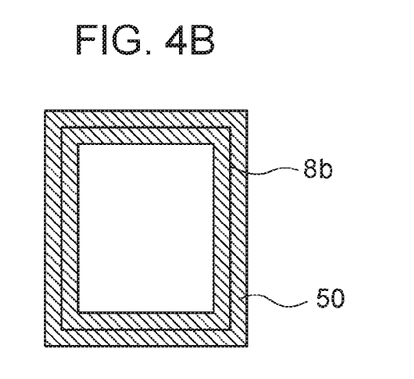
FIG. 4B illustrates the irradiation light with which the region including the side surfaces of the mold is irradiated.
Figure 4C:
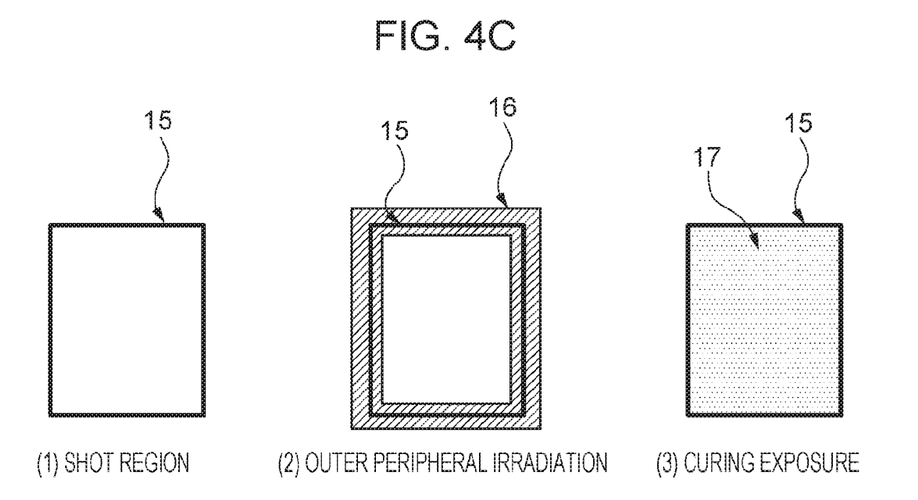
FIG. 4C illustrates the irradiation light with which the region including the side surfaces of the mold is irradiated.

FIG. 4C illustrates the relationship between a shot region 15 on the substrate and the irradiated region. FIG. 4C schematically illustrates the relationship between the shot region 15, the outer peripheral irradiation region 16, and a curing exposure region 17 for curing exposure, which will be described below. The region irradiated in the outer peripheral irradiation step is the outer peripheral region 16 illustrated in "(2) Outer Peripheral Irradiation".

As illustrated in FIGS. 4B and 4C, the outer peripheral region 16 irradiated in the outer peripheral irradiation step is preferably a frame-shaped region that covers the outer periphery of the shot region 15 over the entire periphery thereof. However, discontinuous regions that are not irradiated may be locally provided as long as the imprint material does not protrude. When the region including the side surfaces 8b of the mesa is irradiated with light, edge portions of the shot region in which the imprint material is to be placed can be reliably irradiated, and protrusion of the imprint material from the shot region can be more effectively reduced.

The irradiation with the irradiation light 50 may be started, for example, after the mold 8 is brought into contact with the resin 14 and before imprinting is completed, or before the mold 8 is brought into contact with the resin 14. The time at which the irradiation is to be started differs depending on the type of the resin 14, and therefore needs to be determined by performing experiments. The irradiation light 50 may be any light that causes polymerization reaction of the resin 14, and is not limited to ultraviolet light.

Figure 5A:
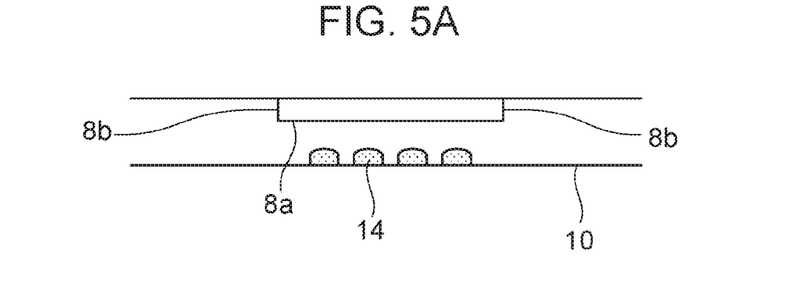
FIG. 5A illustrates the light intensity distribution of the irradiation light with which the region including the side surfaces of the mold is irradiated.
Figure 5B:
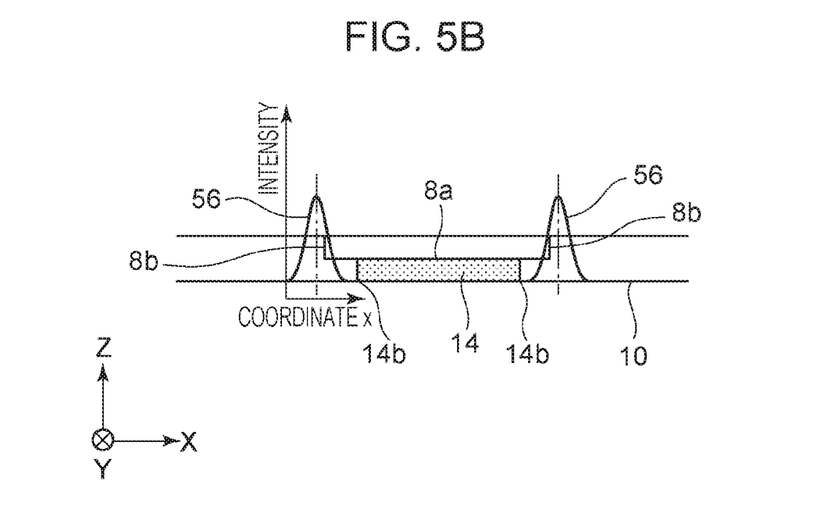
FIG. 5B illustrates the light intensity distribution of the irradiation light with which the region including the side surfaces of the mold is irradiated.

When the resin 14 disposed between the mold 8 and the substrate 10 illustrated in FIG. 5A is pressed, a gas-liquid interface (outermost boundary) 14b of the resin 14 starts to spread toward the outside of the pattern surface 8a of the mold, as illustrated in FIG. 5B. The outer peripheral irradiation with the irradiation light is started before the gas-liquid interface 14b of the resin 14 between the mold 8 and the substrate 10 reaches the side surfaces 8b of the mold 8.

As illustrated in FIG. 5B, the irradiation light 50 has a light intensity distribution 56 along a cross section of the mold 8. The light intensity distribution 56 is shaped such that the light intensity increases from the central region of the mold 8 toward the side surfaces 8b. In FIG. 5B, the light intensity distribution 56 has peaks at positions outside the side surfaces 8b. However, the peaks may instead be at the positions of the side surfaces 8b or at positions inside the side surfaces 8b. At positions outside the peaks of the light intensity distribution 56, the light intensity distribution of the irradiation light 50 are shaped such that the light intensity decreases toward the outside.

Figure 5C:
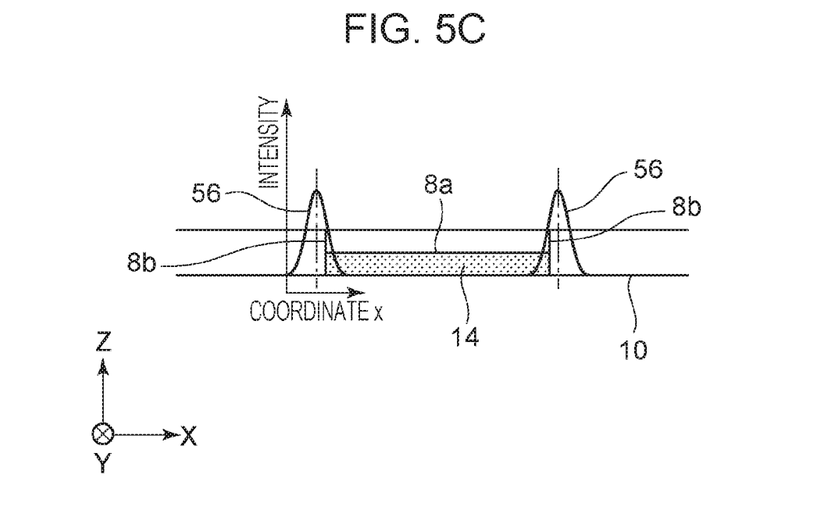
FIG. 5C illustrates the light intensity distribution of the irradiation light with which the region including the side surfaces of the mold is irradiated.

When the resin 14 is further pressed by the mold 8, the gas-liquid interface 14b of the resin 14 further spreads outward, as illustrated in FIG. 5C, and the intensity of the irradiation light 50 with which the resin at the gas-liquid interface 14b is irradiated gradually increases. Since the resin 14 at the gas-liquid interface 14b moves outward, polymerization reaction is gradually started in accordance with the light intensity of the irradiation light 50, and the viscosity of the resin at the gas-liquid interface 14b increases. When the viscosity of the resin at the gas-liquid interface 14b increases, the moving speed of the gas-liquid interface 14b decreases. When the irradiation light 50 is such that the gas-liquid interface 14b stops to move at the time the gas-liquid interface 14b reaches the side surfaces 8b of the mold 8, the resin 14 can be prevented from adhering to the side surfaces 8b of the mold 8. When the resin is not completely cured but is half-cured at this time, the subsequent alignment of the mold and the substrate can be facilitated. In addition, the risk that a defective device will be manufactured or the mold 8 will be damaged can be reduced, and an imprint apparatus with high yield can be provided. The intensity distribution of the irradiation light 50 required to change the viscosity of the resin 14 differs depending on the type of the resin 14, and therefore needs to be determined by performing experiments.

Figure 6:
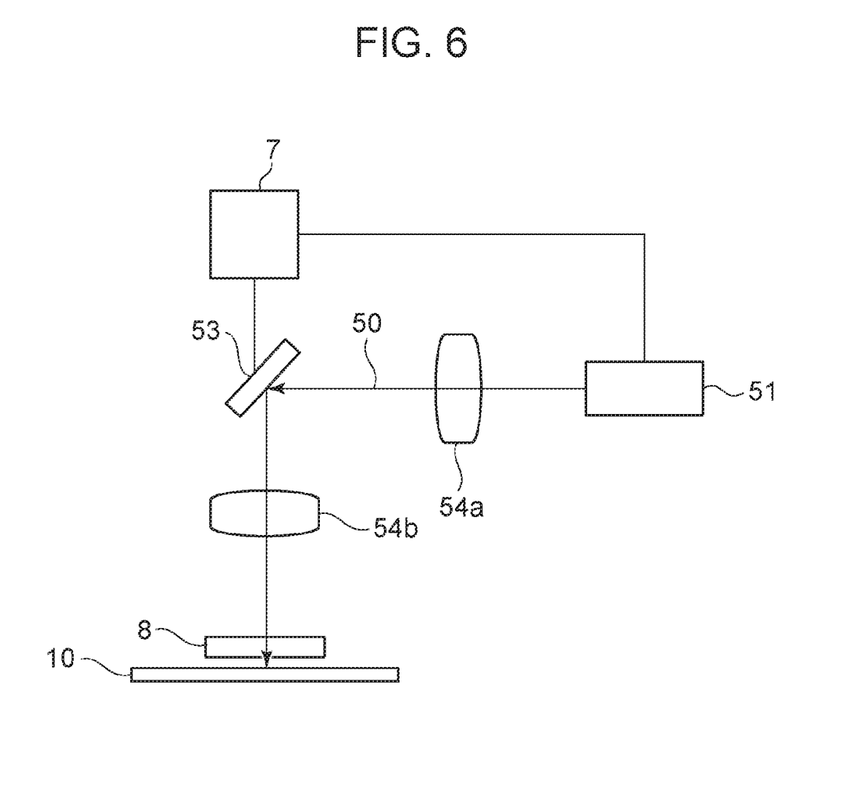
FIG. 6 illustrates the structure of an optical system that generates the irradiation light.

An example of an optical system of the exposure illumination system 2 for irradiating the side surfaces 8b of the mold 8 with the irradiation light 50 will be described. FIG. 6 is a schematic diagram illustrating the optical system. A light source 51 emits light, for example, ultraviolet light, having a wavelength that causes polymerization reaction of the resin 14. A light source having an optical output required to cause a polymerization reaction that changes the viscosity of the resin 14 to a desired viscosity is selected as the light source 51. For example, a lamp, a laser diode, an LED, etc., may be used. The light emitted from the light source 51 is guided by an optical element 54a toward a spatial light modulator 53, which spatially modulates the amplitude, phase, or polarization of the light. In the present embodiment, a digital micromirror device (hereinafter DMD) is used as the spatial light modulator 53. However, other spatial light modulators, such as an LCD device or an LCOS device, may instead be used. When the spatial light modulator 53 is used, the region irradiated with the irradiation light and the intensity of the irradiation light can be more flexibly set than when other devices are used. The light source 51 and the spatial light modulator 53 are controlled by the control unit 7. After the region irradiated with the irradiation light 50 and the light intensity of the irradiation light 50 are controlled by the spatial light modulator 53, the optical element 54b adjusts the magnification at which the irradiation light 50 is projected onto the mold 8 and the substrate 10. The intensity distribution of the irradiation light 50 is realized by optical blur caused by the optical element 54b. According to the present embodiment, since the intensity distribution of the irradiation light is obtained by the optical blur, a relatively inexpensive optical element may be used as the optical element 54b.

In step 104, as illustrated in FIG. 4B, the outer peripheral region including the side surfaces 8b of the mold 8 is selectively irradiated with the irradiation light 50 (outer peripheral irradiation), and the central region of the pattern surface 8a of the mold 8 on which the pattern is formed is not irradiated with the irradiation light 50. Thus, the resin 14 is prevented from adhering to the side surfaces 8b, and the viscosity of the resin 14 does not change in the central region of the pattern surface 8a of the mold 8, so that the resin can be reliably supplied to the pattern surface 8a.

After the mold 8 and the substrate 10 are brought into contact with each other and pressed against each other in step 103, the mold 8 and the substrate 10 are positioned in step 105. The mold 8 and the substrate 10 may continuously be pressed against each other in part of step 105.

If the resin 14 near the side surfaces 8b of the mold 8 is completely cured in step 104, the mold 8 and the substrate 10 cannot be positioned after that and it becomes difficult to perform high-accuracy positioning. In addition, when the mold 8 has a pattern thereof at positions near the side surfaces 8b, the resin 14 is cured before the recesses in the pattern are filled with the resin 14, which leads to an increase in filling defects. The reduction in the positioning accuracy and the increase in filling defects cause a reduction in the yield. Therefore, in step 104, the resin 14 is not completely cured to prevent the reduction in the positioning accuracy and the increase in filling defects.

The positioning step 105 and the outer peripheral irradiation step 104 may be partially or entirely performed simultaneously in parallel. The outer peripheral irradiation step may be performed before or during the positioning step 105.

In step 106, the control unit 7 determines the positioning accuracy. When it is determined that the positioning accuracy satisfies a criterion, the process proceeds to step 107, and the resin in the entire shot region of the substrate is exposed to light by the exposure illumination system 2 so that the resin is cured (curing exposure step). Accordingly, the resin in the recesses in the pattern 8a of the mold 8 is cured and a projecting and recessed pattern of the cured resin is formed. As illustrated in FIG. 4C, an exposed region 17 for the curing exposure (3) may be the same as the shot region (1), and the entirety of this region may be irradiated. Alternatively, the exposed region may be such that the edges thereof coincide with the edges of the outer peripheral irradiation region 16 irradiated in the outer peripheral irradiation performed in step 104.

When the optical system of the exposure illumination system 2 includes the DMD as the spatial light modulator 53, the ultraviolet light can be reflected toward the substrate by the micromirrors of the entire DMD so that the entire shot region is irradiated with the ultraviolet light.

Next, in step 108, the resin and the mold are separated from each other. When it is determined that the positioning accuracy does not satisfy the criterion in step 106, it is determined whether to continue step 105 or to forcibly proceed to the next step depending on the operation of the apparatus.

In step 109, it is determined whether or not the imprint process is completed for all of the designated shot regions of the substrate 10. When the imprint process is completed, the substrate 10 is conveyed out of the imprint apparatus 1. When the imprint process is not completed, the process returns to step 102, and the resin 14 is applied to the next shot region. Then, the steps are repeated until the imprint process is completed.

Steps 102 to 108 are referred to as a "shot", and a plurality of regions in which the mesa of the mold 8 comes into contact with the imprint material (that is, regions in which a pattern is formed on the substrate 10) is referred to as "shot regions". By carrying out a step of successively performing the shot on the plurality of shot regions (manufacturing process), a cured film having a desired projecting and recessed pattern shape (pattern shape corresponding to the shape of projections and recesses on the mold 8) in each of the plurality of shot regions of the substrate 10 can be formed.

Second Embodiment

An imprint process according to the present embodiment is similar to the imprint process of the first embodiment except for step 104 of the flowchart of the imprint process of the first embodiment.

In the first embodiment, a predetermined position is irradiated with the irradiation light 50 in step 104. However, in the present embodiment, the position of the irradiation light 50 is changed in accordance with the position of the gas-liquid interface of the resin 14.

Figure 7A:
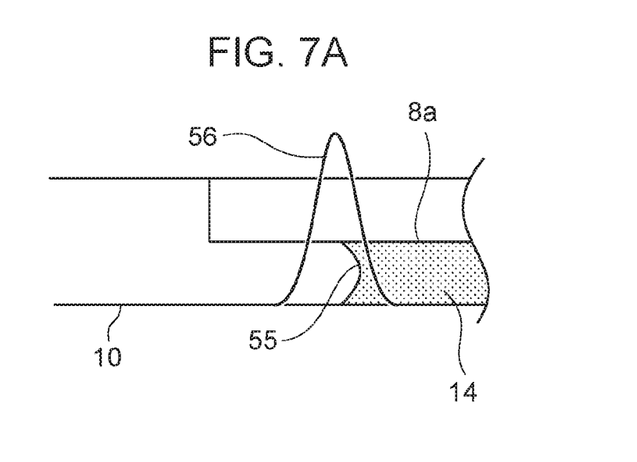
FIG. 7A illustrates the control of a position of irradiation light according to a second embodiment.
Figure 7B:
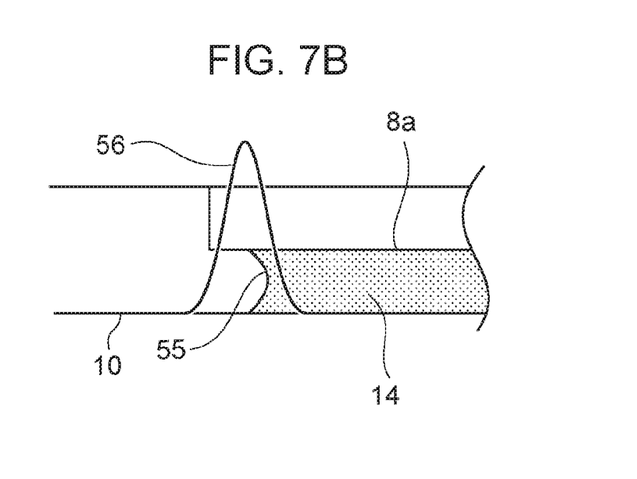
FIG. 7B illustrates the control of the position of the irradiation light according to the second embodiment.

As illustrated in FIG. 7A, when the mold 8 is pressed against the resin 14 in step 103, a gas-liquid interface 55 of the resin 14 moves from the central region of the pattern surface 8a of the mold 8 toward the side surfaces 8b of the mold 8. In step 104 of the present embodiment, a region corresponding to the position of the gas-liquid interface 55 of the resin 14 is irradiated with the irradiation light 50. As illustrated in FIG. 7B, when the mold 8 is further pressed against the resin 14, the gas-liquid interface 55 moves further toward the side surfaces 8b. Therefore, the position of the irradiation light 50 is changed in accordance with the position of the gas-liquid interface 55 of the resin 14. In this case, the resin 14 can be irradiated with the irradiation light 50 only in a region near the gas-liquid interface 55, and the viscosity thereof can be changed only in the region near the gas-liquid interface 55. Since a change in viscosity occurs only in the region near the gas-liquid interface 55, the moving speed of the gas-liquid interface 55 can be reduced, and the resin can be reliably supplied to the pattern 8a of the mold 8.

When a DMD is used as the spatial light modulator 53 described in the first embodiment, the position of the irradiation light 50 can be moved by changing the positions of micromirrors that reflect the irradiation light 50 toward the substrate surface among the micromirrors of the DMD.

Figure 7C:
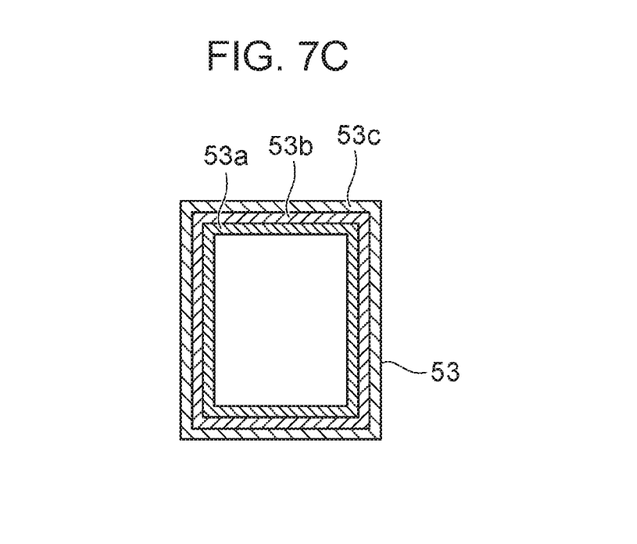
FIG. 7C illustrates the control of the position of the irradiation light according to the second embodiment.

For example, the irradiation light 50 can be moved from the center toward the outside by changing the positions of the micromirrors used to reflect the irradiation light 50 toward the substrate 10 among the micromirrors of the DMD in the order of a first region 53a, a second region 53b, and a third region 54c in FIG. 7C in an outward direction. Thus, the irradiation light 50 can be moved to follow the movement of the gas-liquid interface 55. The moving speed of the gas-liquid interface 55 can be predicted based on the change over time in the gap between the mold 8 and the substrate 10 set in the pressing process performed in step 103. Accordingly, the position of the irradiation light 50 can be controlled based on the predicted moving speed of the gas-liquid interface 55.

Third Embodiment

In the imprint apparatus 1, the shape of the shot region can be controlled by heating the shot region of the substrate to position the shot region of the substrate and the pattern of the mold with respect to each other. The light intensity distribution of heating light is set so that the shot region has a desired shape, and a spatial light modulator is used as an optical element for obtaining such a light intensity distribution. By using the spatial light modulator 53 according to the above-described embodiment as the spatial light modulator for the heating light, a small and simple optical system can be obtained.

Figure 8:
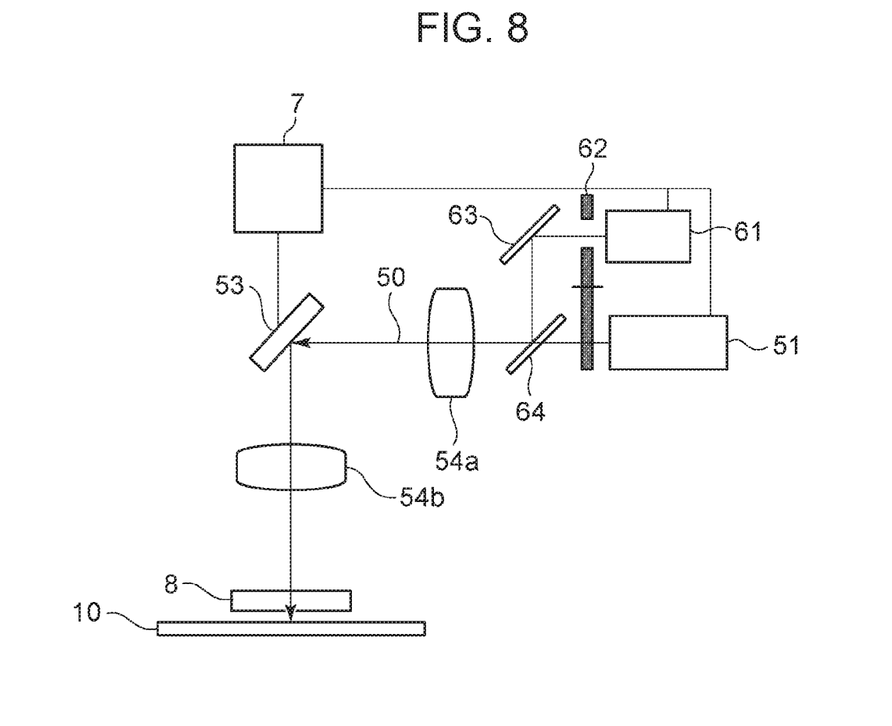
FIG. 8 illustrates the structure of an optical system that generates irradiation light according to a third embodiment.
Figure 9:
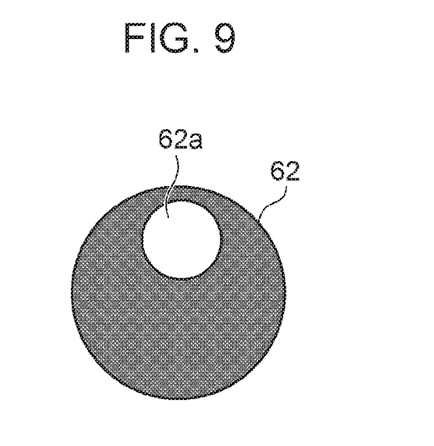
FIG. 9 illustrates the structure of a light shielding plate.

FIG. 8 illustrates the structure of the optical system. A light source 61 that emits light for heating the substrate, a light shielding plate 62, and beam splitters 63 and 64 are added to the optical system illustrated in FIG. 6. As illustrated in FIG. 9, the light shielding plate 62 has an opening 62a and is rotatable. The control unit 7 controls rotation of the light shielding plate 62 so that the opening 62a is placed on the optical path of the heating light when the substrate is heated and that the opening 62a is placed on the optical path of the curing light when the resin is cured. The light that has passed through the opening 62a is incident on the spatial light modulator 53, and is reflected toward the substrate 10. A wavelength filter may be used instead of the light shielding plate 62. The light source 61 and the light source 51 may be configured to emit light of different wavelengths, and light from one of the light source 61 and the light source 51 is transmitted while light from the other is absorbed. Thus, light that is guided to the mold and the substrate can be selected (wavelength selection).

Fourth Embodiment

Although a mold having a pattern portion is used in the above-described embodiments, the above-described apparatus and method, in particular, step 104, may also be applied to a forming apparatus that forms a resin on a substrate into a desired shape by using a mold having no pattern portion.

Embodiment of Method for Manufacturing Article

A method for manufacturing an article is suitable for manufacturing an article, for example, a micro device such as a semiconductor device or a device having a microstructure. A method for manufacturing an article according to the present embodiment includes a step of forming a pattern on an imprint material supplied (applied) to a substrate by using the above-described imprint apparatus (imprint method) and a step of processing the substrate on which the pattern has been formed in the previous step. The manufacturing method further includes other well-known steps (for example, oxidation, film formation, deposition, doping, flattening, etching, resist removal, dicing, bonding, and packaging). The method for manufacturing an article according to the present embodiment is advantageous over methods of the related art in terms of at least one of the performance, quality, ease of production, and production cost of the article.

The pattern of a cured product formed by using the imprint apparatus may be used permanently as at least a portion of various articles or temporarily when various articles are manufactured. Examples of the articles include an electric circuit element, an optical element, a MEMS, a recording element, a sensor, and a mold. The electric circuit element may be a volatile or non-volatile semiconductor memory, such as a DRAM, an SRAM, a flash memory, or an MRAM, or a semiconductor element, such as an LSI, a CCD, an image sensor, or an FPGA. The mold may be an imprint mold.

The pattern of the cured product may be used directly as a component of at least a portion of the above-described articles or temporarily as a resist mask. The resist mask is removed after etching, ion implantation, etc., is performed in a step of processing a substrate.

Figure 10A:
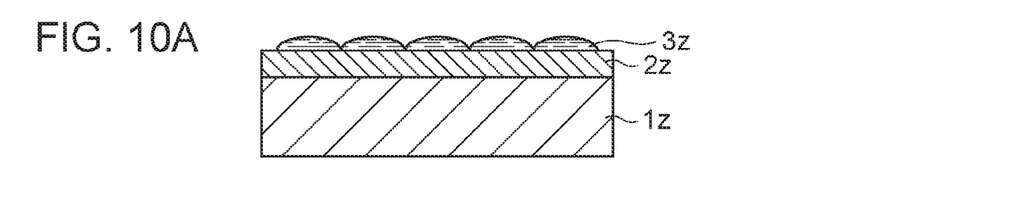
FIG. 10A illustrates a method for manufacturing an article.

A specific method for manufacturing an article will now be described. As illustrated in FIG. 10A, a substrate $1z$, such as a silicon wafer, having a surface on which a processing material $2z$, such as an insulator, is provided is prepared. Next, an imprint material $3z$ is applied to a surface of the processing material $2z$ by, for example, an inkjet method. FIG. 10A shows the imprint material $3z$ that has been applied to the substrate in the form of a plurality of droplets.

Figure 10B:
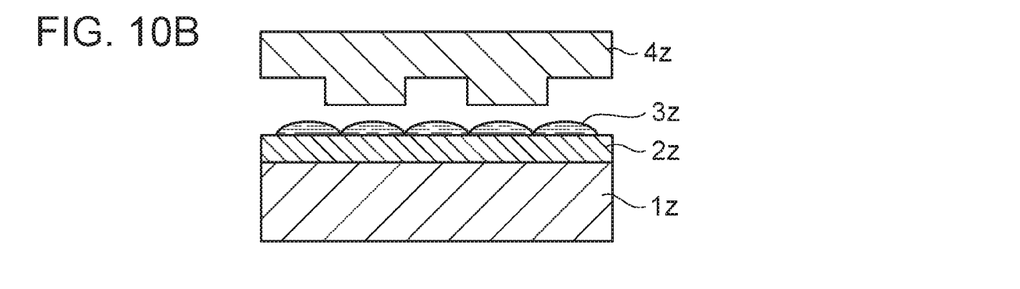
FIG. 10B illustrates the method for manufacturing an article.
Figure 10C:
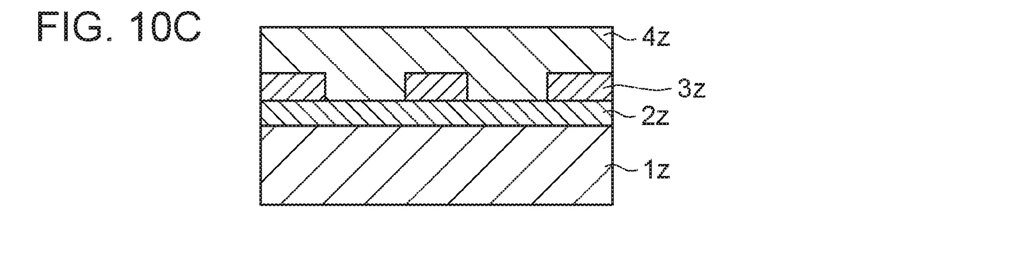
FIG. 10C illustrates the method for manufacturing an article.

As illustrated in FIG. 10B, a mold $4z$ for an imprint process is placed so that a side thereof on which a projecting and recessed pattern is formed faces the imprint material $3z$ on the substrate. As illustrated in FIG. 10C, the substrate $1z$ to which the imprint material $3z$ is applied and the mold $4z$ are brought into contact with each other, and a pressure is applied thereto. The space between the mold $4z$ and the processing material $2z$ is filled with the imprint material $3z$. In this state, the imprint material $3z$ is irradiated with light, which serves as curing energy, through the mold $4z$, and is thereby cured.

Figure 10D:
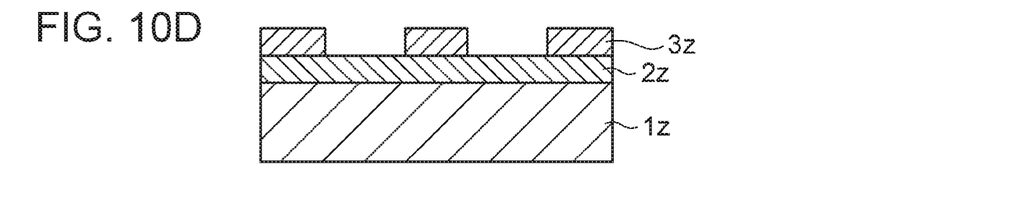
FIG. 10D illustrates the method for manufacturing an article.

As illustrated in FIG. 10D, when the mold $4z$ and the substrate $1z$ are separated from each other after the imprint material $3z$ is cured, a pattern of a cured product composed of the imprint material $3z$ is formed on the substrate $1z$. The pattern of the cured product is shaped such that recesses in the mold correspond to projections on the cured product and projections on the mold correspond to recesses in the cured product. In other words, the projecting and recessed pattern of the mold $4z$ is transferred to the imprint material $3z$.

Figure 10E:
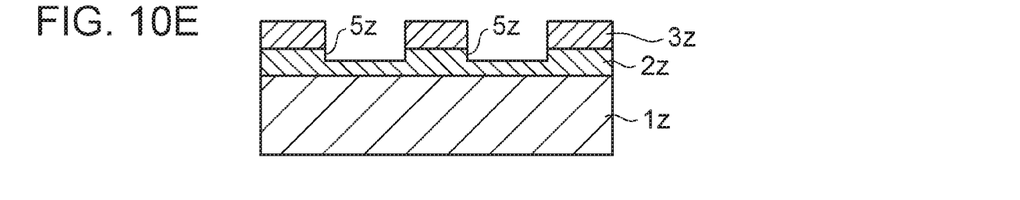
FIG. 10E illustrates the method for manufacturing an article.
Figure 10F:
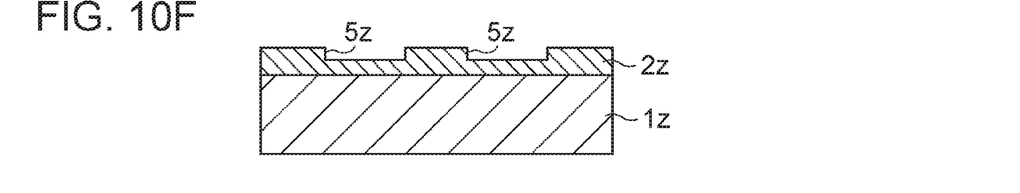
FIG. 10F illustrates the method for manufacturing an article.

As illustrated in FIG. 10E, when etching is performed by using the pattern of the cured product as an etching resistant mask, portions of the surface of the processing material $2z$ on which the cured product is not formed or on which the cured product has a small thickness are removed so that grooves $5z$ are formed. As illustrated in FIG. 10F, when the pattern of the cured product is removed, an article having the grooves $5z$ in the surface of the processing material $2z$ can be obtained. Although the pattern of the cured product is removed in this example, the pattern of the cured product may instead be left after the processing material $2z$ is processed and used as, for example, a film for interlayer insulation in, for example, a semiconductor element. In other words, the pattern of the cured product may be used as a component of the article.

Although preferred embodiments of the present invention have been described, it goes without saying that the present invention is not limited to the embodiments, and various modifications and alterations are possible within the scope of the present invention.

According to the present invention, the substrate and the mold can be positioned with respect to each other and protrusion of the imprint material on the substrate can be reduced when the imprint material and the mold are brought into contact with each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An imprint apparatus that forms a cured product of an imprint material on a substrate by using a mold having a mesa, the imprint apparatus comprising:
   a mold holder that holds the mold;
   an optical system that irradiates the imprint material on the substrate with irradiation light for increasing a viscosity of the imprint material; and
   a control unit composed of a computer configured to execute a program that:
      causes the optical system to provide the irradiation light such that the irradiation light has a light intensity distribution in which a light intensity increases from a center of the mesa of the mold toward a side surface of the mesa when the mold is held by the mold holder, and
      while the mold and the imprint material on the substrate are in contact with each other, causes the optical system to irradiate, with the irradiation light having the light intensity smaller than a peak of the light intensity distribution, a boundary surface of the imprint material between the mold and the substrate that moves from the center of the mesa of the mold toward the side surface of the mesa in a region including the side surface of the mesa.

2. The imprint apparatus according to claim 1, wherein the optical system includes a spatial light modulator that forms the light intensity distribution.

3. The imprint apparatus according to claim 2, wherein executing the program causes the optical system to form a light intensity distribution of light that heats the substrate by using the spatial light modulator.

4. The imprint apparatus according to claim 1, wherein the mesa includes a pattern surface having a projecting and recessed pattern.

5. The imprint apparatus according to claim 1, wherein the light intensity distribution has the peak at a position outside the side surface of the mesa.

6. The imprint apparatus according to claim 1, wherein executing the program causes a position of the light intensity distribution is changed in accordance with a position of the boundary surface of the imprint material between the mold and the substrate.

7. The imprint apparatus according to claim 1, wherein executing the program causes the irradiation with the irradiation light to start before the boundary surface of the imprint material between the mold and the substrate reaches the side surface of the mesa.

8. An imprint apparatus that forms a cured product of an imprint material on a substrate by using a mold, the imprint apparatus comprising:
 a mold holder that holds the mold;
 an optical system that irradiates the imprint material on the substrate with irradiation light; and
 a control unit composed of a computer configured to execute a program that causes the optical system to use a spatial light modulator to perform:
  entire irradiation, in which an entirety of a shot region of the substrate is irradiated, and
  outer peripheral irradiation, in which an outer peripheral region of the shot region is selectively irradiated,
 wherein performing the outer peripheral irradiation by executing the program includes providing a light intensity distribution in which a light intensity increases from a center of the shot region toward an outer periphery of the shot region when the mold is held by the mold holder, and
 wherein performing the outer peripheral irradiation by executing the program includes starting the outer peripheral irradiation so that a boundary surface of the imprint material between the mold and the substrate that moves from the center of the shot region toward a side surface of the shot region is irradiated with the irradiation light having the light intensity smaller than a peak of the light intensity distribution, while the mold and the imprint material on the substrate are in contact with each other.

9. The imprint apparatus according to claim 8, wherein the mold includes a mesa that comes into contact with the imprint material, and executing the program causes the outer peripheral irradiation to be performed such that the outer peripheral region of the shot region that is irradiated includes a side surface of the mesa.

10. The imprint apparatus according to claim 9, further comprising positioning means that performs positioning of the substrate and the mold with respect to each other, and executing the program causes the outer peripheral irradiation to be performed before or during the positioning.

11. The imprint apparatus according to claim 9, wherein executing the program causes the outer peripheral irradiation to be performed such that an outer peripheral region including a side surface of the shot region is irradiated with the irradiation light and a central region of the shot region is not irradiated with the irradiation light.

12. An apparatus that forms a cured product of an curable material on a substrate by using a member, the apparatus comprising:
 a holder that holds the member;
 an optical system that irradiates the curable material on the substrate with irradiation light for increasing a viscosity of the curable material; and
 a control unit composed of a computer configured to execute a program that:
  causes the optical system to provide the irradiation light such that the irradiation light has a light intensity distribution in which a light intensity increases from a center of contact region where the member and the substrate are in contact toward a side surface of the contact region, and
  while the member and the curable material on the substrate are in contact with each other, causes the optical system to irradiate, with the irradiation light having the light intensity smaller than a peak of the light intensity distribution, a boundary surface of the curable material between the member and the substrate that moves from the center of the contact region toward the side surface of the contact region in a region including the side surface of the contact region.

13. A method for manufacturing an article, the method comprising:
 a step of forming a pattern on a substrate by using the imprint apparatus according to claim 1; and
 a step of processing the substrate on which the pattern is formed,
 wherein an article is manufactured by using the processed substrate.

* * * * *